ent No.: US 8,823,156 B2
(45) Date of Patent: Sep. 2, 2014

(12) United States Patent
Hsieh

(10) Patent No.: US 8,823,156 B2
(45) Date of Patent: Sep. 2, 2014

(54) SEMICONDUCTOR DEVICE PACKAGES HAVING STACKING FUNCTIONALITY AND INCLUDING INTERPOSER

(75) Inventor: Po-Chi Hsieh, Zhongli (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 852 days.

(21) Appl. No.: 13/024,270

(22) Filed: Feb. 9, 2011

(65) Prior Publication Data

US 2011/0193205 A1 Aug. 11, 2011

(30) Foreign Application Priority Data

Feb. 10, 2010 (TW) ................................ 99104153 A

(51) Int. Cl.
*H01L 23/52* (2006.01)
(52) U.S. Cl.
USPC .... 257/686; 257/691; 257/700; 257/E23.141; 257/E23.172; 257/773; 438/107; 438/455
(58) Field of Classification Search
None
See application file for complete search history.

(56) References Cited

U.S. PATENT DOCUMENTS

| | | | |
|---|---|---|---|
| 5,072,289 A | 12/1991 | Sugimoto et al. |
| 5,128,831 A | 7/1992 | Fox, III et al. |
| 5,139,610 A | 8/1992 | Dunaway et al. |
| 5,207,585 A | 5/1993 | Byrnes et al. |
| 5,222,014 A | 6/1993 | Lin |
| 5,355,580 A | 10/1994 | Tsukada |
| 5,397,997 A | 3/1995 | Tuckerman et al. |
| 5,400,948 A | 3/1995 | Sajja et al. |
| 5,468,681 A | 11/1995 | Pasch |
| 5,579,207 A | 11/1996 | Hayden et al. |
| 5,594,275 A | 1/1997 | Kwon et al. |

(Continued)

FOREIGN PATENT DOCUMENTS

| | | |
|---|---|---|
| JP | 07335783 | 12/1995 |
| JP | 2000294720 | 10/2000 |

(Continued)

OTHER PUBLICATIONS

Yoshida et al., "A Study on Package Stacking Process for Package-on-Package (PoP)"; Electronic Components and Tech. Conf. (ECTC), May 2006, San Diego, CA.

(Continued)

*Primary Examiner* — Julio J Maldonado
*Assistant Examiner* — Molly Reida
(74) *Attorney, Agent, or Firm* — Klein, O'Neill & Singh, LLP

(57) ABSTRACT

A semiconductor device package with an interposer, which serves as an intermediate or bridge circuit of various electrical pathways in the package to electrically connect any two or more electrical contacts, such as any two or more electrical contacts of a substrate and a chip. In particular, the interposer provides electrical pathways for simplifying a circuit layout of the substrate, reducing the number of layers of the substrate, thereby reducing package height and manufacturing cost. Furthermore, the tolerance of the circuit layout can be increased or maintained, while controlling signal interference between adjacent traces and accommodating high density circuit designs. Moreover, the package is suitable for a PoP process, where a profile of top solder balls on the substrate and a package body can be varied according to particular applications, so as to expose at least a portion of each of the top solder balls and electrically connect the package to another device through the exposed, top solder balls.

16 Claims, 3 Drawing Sheets

(56) References Cited

U.S. PATENT DOCUMENTS

| | | |
|---|---|---|
| 5,608,265 A | 3/1997 | Kitano et al. |
| 5,714,800 A | 2/1998 | Thompson |
| 5,726,493 A | 3/1998 | Yamashita et al. |
| 5,748,452 A | 5/1998 | Londa |
| 5,763,939 A | 6/1998 | Yamashita |
| 5,844,315 A | 12/1998 | Melton et al. |
| 5,861,666 A | 1/1999 | Bellaar |
| 5,883,426 A | 3/1999 | Tokuno et al. |
| 5,889,327 A | 3/1999 | Washida et al. |
| 5,889,655 A | 3/1999 | Barrow |
| 5,892,290 A | 4/1999 | Chakravorty et al. |
| 5,929,521 A | 7/1999 | Wark et al. |
| 5,973,393 A | 10/1999 | Chia et al. |
| 5,985,695 A | 11/1999 | Freyman et al. |
| 6,072,236 A | 6/2000 | Akram et al. |
| 6,177,724 B1 | 1/2001 | Sawai |
| 6,194,250 B1 | 2/2001 | Melton et al. |
| 6,195,268 B1 | 2/2001 | Eide |
| 6,303,997 B1 | 10/2001 | Lee |
| 6,448,665 B1 | 9/2002 | Nakazawa et al. |
| 6,451,624 B1 | 9/2002 | Farnworth et al. |
| 6,461,881 B1 | 10/2002 | Farnworth et al. |
| 6,489,676 B2 | 12/2002 | Taniguchi et al. |
| 6,501,165 B1 | 12/2002 | Farnworth et al. |
| 6,513,236 B2 | 2/2003 | Tsukamoto |
| 6,521,995 B1 | 2/2003 | Akram et al. |
| 6,525,413 B1 | 2/2003 | Cloud et al. |
| 6,614,104 B2 | 9/2003 | Farnworth et al. |
| 6,617,687 B2 | 9/2003 | Adram et al. |
| 6,740,546 B2 | 5/2004 | Corisis et al. |
| 6,740,964 B2 | 5/2004 | Sasaki |
| 6,780,746 B2 | 8/2004 | Kinsman et al. |
| 6,787,392 B2 | 9/2004 | Quah |
| 6,798,057 B2 | 9/2004 | Bolkin et al. |
| 6,812,066 B2 | 11/2004 | Taniguchi et al. |
| 6,815,254 B2 | 11/2004 | Mistry et al. |
| 6,828,665 B2 | 12/2004 | Pu et al. |
| 6,847,109 B2 | 1/2005 | Shim |
| 6,861,288 B2 | 3/2005 | Shim et al. |
| 6,888,255 B2 | 5/2005 | Murtuza et al. |
| 6,924,550 B2 | 8/2005 | Corisis et al. |
| 6,936,930 B2 | 8/2005 | Wang |
| 6,974,334 B2 | 12/2005 | Hung |
| 7,002,805 B2 | 2/2006 | Lee |
| 7,015,571 B2 | 3/2006 | Chang et al. |
| 7,026,709 B2 | 4/2006 | Tsai et al. |
| 7,029,953 B2 | 4/2006 | Sasaki |
| 7,034,386 B2 | 4/2006 | Kurita |
| 7,049,692 B2 | 5/2006 | Nishimura et al. |
| 7,061,079 B2 | 6/2006 | Weng et al. |
| 7,071,028 B2 | 7/2006 | Koike et al. |
| 7,129,576 B2 | 10/2006 | Humpston |
| 7,185,426 B1 | 3/2007 | Hiner et al. |
| 7,187,068 B2 | 3/2007 | Suh et al. |
| 7,221,045 B2 | 5/2007 | Park et al. |
| 7,242,081 B1 | 7/2007 | Lee |
| 7,242,099 B2 | 7/2007 | Lin et al. |
| 7,262,080 B2 | 8/2007 | Go et al. |
| 7,279,784 B2 | 10/2007 | Liu |
| 7,279,789 B2 | 10/2007 | Cheng |
| 7,288,835 B2 | 10/2007 | Yim et al. |
| 7,291,929 B2 | 11/2007 | Tanaka et al. |
| 7,309,913 B2 | 12/2007 | Shim et al. |
| 7,345,361 B2 | 3/2008 | Mallik et al. |
| 7,354,800 B2 | 4/2008 | Carson |
| 7,364,945 B2 | 4/2008 | Shim et al. |
| 7,364,948 B2 | 4/2008 | Lai et al. |
| 7,365,427 B2 | 4/2008 | Lu et al. |
| 7,372,141 B2 | 5/2008 | Karnezos et al. |
| 7,372,151 B1 | 5/2008 | Fan et al. |
| 7,394,663 B2 | 7/2008 | Yamashita et al. |
| 7,408,244 B2 | 8/2008 | Lee et al. |
| 7,417,329 B2 | 8/2008 | Chuang et al. |
| 7,429,786 B2 | 9/2008 | Karnezos et al. |
| 7,429,787 B2 | 9/2008 | Karnezos et al. |
| 7,436,055 B2 | 10/2008 | Hu |
| 7,436,074 B2 | 10/2008 | Pan et al. |
| 7,473,629 B2 | 1/2009 | Tai et al. |
| 7,485,970 B2 | 2/2009 | Hsu et al. |
| 7,550,832 B2 | 6/2009 | Weng et al. |
| 7,550,836 B2 | 6/2009 | Chou et al. |
| 7,560,818 B2 | 7/2009 | Tsai |
| 7,586,184 B2 | 9/2009 | Hung et al. |
| 7,589,408 B2 | 9/2009 | Weng et al. |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,714,453 B2* | 5/2010 | Khan et al. ............... 257/787 |
| 7,719,094 B2 | 5/2010 | Wu et al. |
| 7,723,839 B2 | 5/2010 | Yano et al. |
| 7,728,431 B2 | 6/2010 | Harada et al. |
| 7,737,539 B2 | 6/2010 | Kwon et al. |
| 7,737,565 B2 | 6/2010 | Coffy |
| 7,750,455 B2 | 7/2010 | Pagaila et al. |
| 7,750,465 B2* | 7/2010 | Hess et al. ............... 257/724 |
| 7,777,351 B1 | 8/2010 | Berry et al. |
| 7,807,512 B2 | 10/2010 | Lee et al. |
| 7,834,464 B2 | 11/2010 | Meyer et al. |
| 7,838,334 B2 | 11/2010 | Yu et al. |
| 8,039,303 B2 | 10/2011 | Shim et al. |
| 8,076,765 B2* | 12/2011 | Chen et al. ............... 257/686 |
| 2003/0090883 A1 | 5/2003 | Asahi et al. |
| 2003/0129272 A1 | 7/2003 | Shen et al. |
| 2004/0106232 A1 | 6/2004 | Sakuyama et al. |
| 2004/0124515 A1 | 7/2004 | Tao et al. |
| 2004/0191955 A1 | 9/2004 | Joshi et al. |
| 2005/0029644 A1 | 2/2005 | Ho et al. |
| 2005/0054187 A1 | 3/2005 | Ding et al. |
| 2005/0117835 A1 | 6/2005 | Nguyen et al. |
| 2005/0121764 A1 | 6/2005 | Mallik |
| 2006/0035409 A1 | 2/2006 | Suh et al. |
| 2006/0220210 A1 | 10/2006 | Karnezos et al. |
| 2006/0240595 A1 | 10/2006 | Lee et al. |
| 2006/0244117 A1 | 11/2006 | Karnezos et al. |
| 2007/0029668 A1 | 2/2007 | Lin et al. |
| 2007/0090508 A1 | 4/2007 | Lin et al. |
| 2007/0108583 A1 | 5/2007 | Shim et al. |
| 2007/0241453 A1 | 10/2007 | Ha et al. |
| 2007/0273049 A1 | 11/2007 | Khan et al. |
| 2007/0290376 A1 | 12/2007 | Zhao et al. |
| 2008/0017968 A1 | 1/2008 | Choi et al. |
| 2008/0054491 A1* | 3/2008 | Makino et al. ............ 257/784 |
| 2008/0073769 A1* | 3/2008 | Wu et al. ................... 257/686 |
| 2008/0116574 A1 | 5/2008 | Fan |
| 2008/0230887 A1 | 9/2008 | Sun et al. |
| 2008/0251906 A1* | 10/2008 | Eaton et al. ............... 257/686 |
| 2009/0101400 A1 | 4/2009 | Yamakoshi |
| 2009/0127686 A1 | 5/2009 | Yang et al. |
| 2010/0000775 A1 | 1/2010 | Shen et al. |
| 2010/0171205 A1 | 7/2010 | Chen et al. |
| 2010/0171206 A1 | 7/2010 | Chu et al. |
| 2010/0171207 A1 | 7/2010 | Shen et al. |
| 2010/0214780 A1 | 8/2010 | Villard |
| 2010/0244208 A1 | 9/2010 | Pagaila et al. |
| 2010/0320585 A1 | 12/2010 | Jiang et al. |
| 2011/0049704 A1 | 3/2011 | Sun et al. |
| 2011/0068453 A1 | 3/2011 | Cho et al. |
| 2011/0117700 A1 | 5/2011 | Weng et al. |
| 2011/0140364 A1 | 6/2011 | Head |
| 2011/0156251 A1 | 6/2011 | Chu et al. |
| 2011/0241192 A1 | 10/2011 | Ding et al. |
| 2011/0241193 A1 | 10/2011 | Ding et al. |
| 2011/0278741 A1 | 11/2011 | Chua et al. |

FOREIGN PATENT DOCUMENTS

| | | |
|---|---|---|
| JP | 2001298115 | 10/2001 |
| JP | 2002158312 | 5/2002 |
| JP | 2002170906 | 6/2002 |
| JP | 2004327855 | 11/2004 |
| JP | 2009054686 | 3/2009 |
| KR | 2002043435 | 6/2002 |
| KR | 2003001963 | 1/2010 |

(56) References Cited

FOREIGN PATENT DOCUMENTS

| | | |
|---|---|---|
| TW | 0529155 | 4/2003 |
| TW | 1229927 | 3/2005 |
| TW | 200611305 | 1/2006 |

OTHER PUBLICATIONS

Dreiza et al., "High Density PoP (Package-on-Package) and Package Stacking Development"; Electronic Components and Technology Conference, 2007.

Wang et al., "Coupled power and thermal cycling reliability of board-level package-on-package atacking assembly" IEEE Transactions on Electronics Packaging Manufacturing, 32(1): 14-21, 2009.

Lai et al., "Optimization of thermomechanical reliability of board-level package-on-package stacking assembly" IEEE Transactions on Components and Packaging Technologies, 29(4): 864-868, 2006.

Wang et al., "Board-level reliability of package-on-package stacking assemblies subjected to coupled power and thermal cycling tests" 9th Electronics Packaging Technology Conference, 2007.

* cited by examiner

SEMICONDUCTOR DEVICE PACKAGES HAVING STACKING FUNCTIONALITY AND INCLUDING INTERPOSER

CROSS-REFERENCE TO RELATED APPLICATION

This application claims priority to Taiwan Application Serial No. 99104153, filed on Feb. 10, 2010, the disclosure of which is incorporated herein by reference in its entirety.

TECHNICAL FIELD

The present disclosure relates to semiconductors and more particularly to semiconductor assembly and packaging.

BACKGROUND

In a package-on-package (PoP) semiconductor device, multiple semiconductor packages are stacked and secured to one another. For example, a package including a memory chip can be stacked on a package including a logic chip. With a conventional PoP structure, the available surface area for laying out a circuit on the package substrate is limited. Thus, interference between signals can occur when circuit paths are positioned too close to one another. One solution to this problem is to increase the number of layers in a multi-layered substrate. However, this solution increases manufacturing costs. Thus, it would be desirable to limit interference between circuit paths without increasing the number of layers in a multi-layered substrate.

SUMMARY

One embodiment of the present semiconductor device packages comprises a substrate including a first surface, a second surface opposite the first surface, a plurality of first electrical contacts disposed on or adjacent to the first surface, and a plurality of second electrical contacts disposed on or adjacent to the second surface. The semiconductor device package further comprises a semiconductor chip disposed on or adjacent to the second surface of the substrate, and electrically coupled to the substrate. The semiconductor device package further comprises an interposer disposed on or adjacent to the semiconductor chip and electrically coupled to the substrate. At least one of the first contacts is electrically coupled to at least one of the second contacts through the interposer.

Another embodiment of the present semiconductor device packages comprises a substrate including a top surface, a plurality of electrical contacts disposed on or adjacent to the top surface. The semiconductor device package further comprises a semiconductor chip disposed on or adjacent to the top surface of the substrate, and electrically coupled to the substrate. The chip includes a plurality of edges. The semiconductor device package further comprises an interposer disposed on or adjacent to the semiconductor chip and electrically coupled to the substrate. A first one of the contacts is located adjacent a first one of the edges of the chip, and a second one of the contacts is located adjacent a second one of the edges of the chip, and the first contact is electrically coupled to the second contact through the interposer.

Another embodiment of the present semiconductor device packages comprises a substrate including a surface and a plurality of substrate electrical contacts disposed on or adjacent to the surface. The semiconductor device package further comprises a semiconductor chip disposed on or adjacent to the surface of the substrate, and electrically coupled to the substrate. The chip includes a plurality of edges and at least a first chip electrical contact adjacent to a first one of the edges. The semiconductor device package further comprises an interposer disposed on or adjacent to the semiconductor chip and electrically coupled to the substrate. A first one of the substrate contacts is located adjacent a second one of the edges of the chip, and the first substrate contact is electrically coupled to the first chip contact through the interposer.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
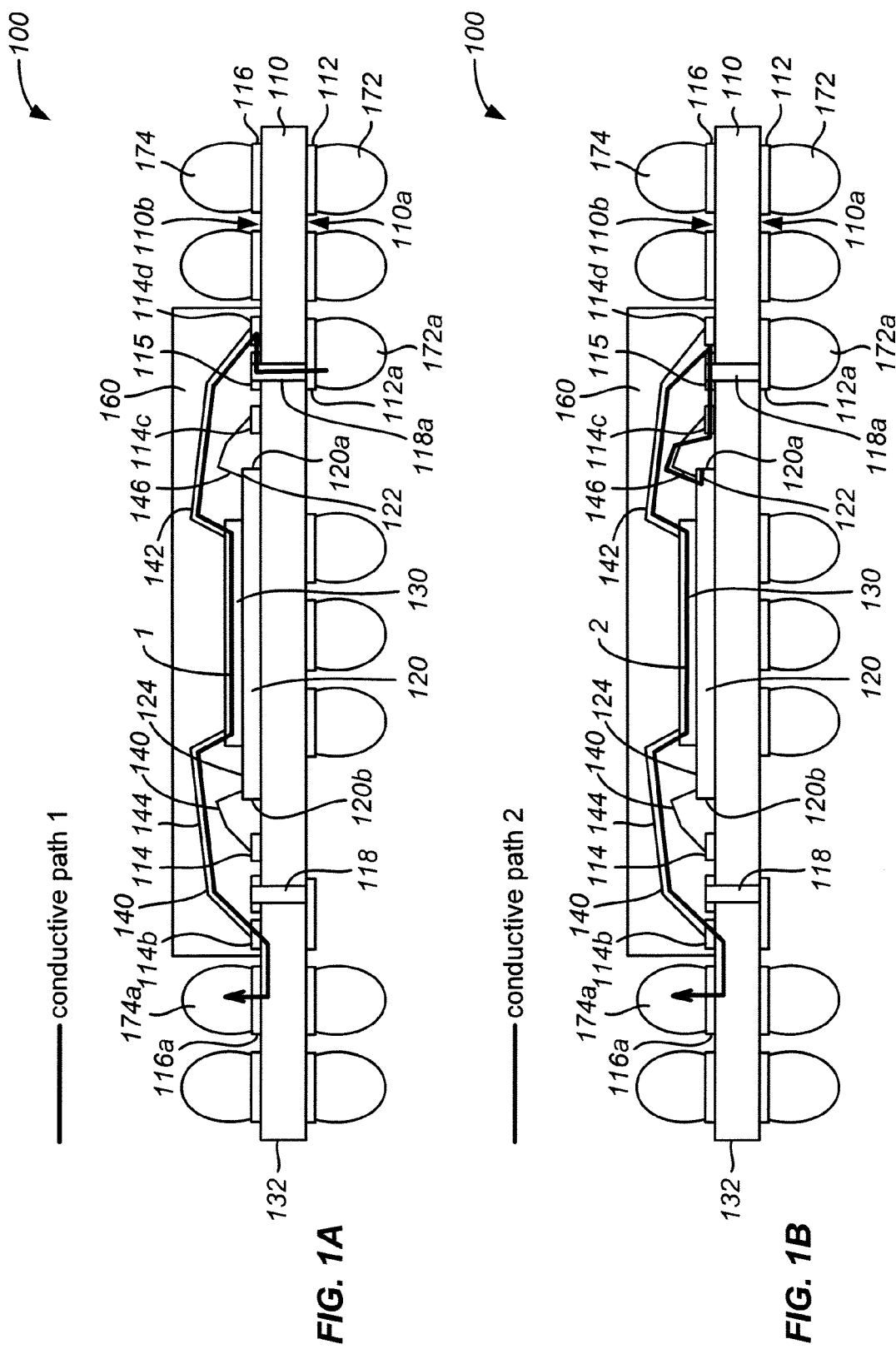
FIG. 1A is a cross-sectional view of a semiconductor package structure according to one of the present embodiments, illustrating one conductive path.
FIG. 1B is a cross-sectional view of the semiconductor package structure of FIG. 1A, illustrating another conductive path.

Referring to FIG. 1A, a cross-sectional view of a semiconductor device package 100 according to one of the present embodiments is illustrated. The package 100 is configured to be stacked with one or more additional packages (not shown). Accordingly, the package 100 is configured for use in a package-on-package (PoP) semiconductor device. The package 100 includes a substrate 110, a semiconductor chip 120 (or another active or passive semiconductor device), an interposer 130, and a package body 160. The substrate 110 includes a first surface, or bottom surface 110a, and a second surface, or top surface 110b opposite thereto. The chip 120 is disposed on or adjacent to the top surface 110b of the substrate 110, for example by a die attach material such as an adhesive or film adhesive. The chip 120 is electrically coupled to the substrate 110. In the illustrated embodiment, the chip 120 is electrically coupled to the substrate 110 by wire bonding, but other techniques for electrical coupling could be used instead, such as a flip-chip process. While FIG. 1A illustrates only one chip 120, in other embodiments multiple chips may be provided within the package 100.

A plurality of bottom electrical contacts are located on or adjacent to the substrate bottom surface 110a. In the illustrated embodiment, the bottom electrical contacts include a plurality of bottom pads 112 and a plurality of corresponding bottom solder balls 172 positioned on or adjacent thereto. The bottom solder balls 172 are configured for electrically coupling the package 100 to an external circuit, such as a printed circuit board (PCB). The bottom pads 112 may be formed from a metal, a metal alloy, or another suitable electrically conductive material, which may be plated onto the substrate 110. In alternative embodiments the solder pads 112 and solder balls 172 may be replaced with conductive bumps, connecting elements, etc.

A plurality of top electrical contacts is located on or adjacent to the substrate top surface 110b. In the illustrated embodiment, the top electrical contacts include a plurality of wire bond pads 114, a plurality of via pads 115, a plurality of top pads 116, and a plurality of corresponding top solder balls 174 positioned on or adjacent thereto. The top solder balls 174 are configured for electrically coupling the package 100 to another device or package stacked thereonto form a stacked package assembly. The other device may be, for example and without limitation, an unpackaged chip, a passive device or another semiconductor device package. The wire bond pads 114 and the top pads 116 may be formed from a metal, a metal alloy, or another suitable electrically conductive material, which may be plated onto the substrate 110. In alternative embodiments the wire bond pads 114, the pads 116 and the solder balls 174 may be replaced with conductive bumps or studs (to include under bump metallurgy (UBM), connecting elements, etc.

A plurality of bonding wires 140 electrically couple the chip 120 and the interposer 130 with the wire bond pads 114. The chip 120 is coupled with a first subset of the wire bond pads 114 through bonding wires 140 such as the bonding wire 146, and the interposer 130 is coupled with a second subset of the wire bond pads 114 through bonding wires 140 such as the bonding wires 142, 144.

In the illustrated embodiment, the top pads 116 are disposed laterally with respect to the chip 120. For example, the top pads 116 may form one or more rows/columns extending parallel to edges of the substrate 110. Also in the illustrated embodiment, the wire bond pads 114 are disposed laterally with respect to the chip 120 and between the top pads 116 and the chip 120. In alternative embodiments, the relative locations of the wire bond pads 114 and the top pads 116 with respect to the chip 120 may be reversed or otherwise varied.

The substrate 110 further includes a plurality of conductive vias 118. Each via 118 extends from the top surface 110b to the bottom surface 110a of the substrate 110. However, in alternative embodiments the extent of the vias 118 can be varied. The vias 118 can be implemented as through-holes plated with a metal, a metal alloy, or another suitable electrically conductive material. One of the conductive vias 118a electrically couples one of the via pad 115 with one of the bottom pads 112a.

In the illustrated embodiment, the interposer 130 is disposed on or adjacent to the chip 120. In particular, the interposer 130 of FIG. 1A is disposed on a top surface 124 of the chip 120. In other words, one surface of the chip 120 is coupled to the substrate 110 and the opposite surface of the chip is coupled to the interposer 130. In alternative embodiments the relative locations of the interposer 130 and the chip 120 (with respect to the substrate 110) can be reversed or otherwise varied.

In the embodiment of FIG. 1A, the package body 160 (or encapsulant) is disposed on or adjacent to the top surface 110b of the substrate 110, and encapsulates the chip 120, the interposer 130, the bonding wires 140, and the wire bond pads 114. A peripheral portion of the top surface 110b, along with the top pads 116 and the top solder balls 174, remains exposed or uncovered by the package body 160. The package body 160 can be formed from a molding compound, which may have a plastic content, such as one including a polymer and a suitable filler.

FIG. 1A illustrates an example of a conductive path 1 between a bottom solder ball 172a and a top solder ball 174a. The conductive path 1 electrically couples the solder balls 172a, 174a through the bottom pad 112a, the conductive via 118a, the via pad 115, a wire bond pad 114d (which is electrically coupled to the via pad 115 through a conductive trace on the substrate 110, described further herein), a bonding wire 142, the interposer 130, a bonding wire 144, a wire bond pad 114b, and a top solder pad 116a (which is electrically coupled to the wire bond pad 114b through a conductive trace on the substrate 110, described further herein).

The interposer 130 of the illustrated embodiment thus advantageously provides a pathway for electrically coupling the via pad 115 adjacent a first edge 120a of the chip 120 and the wire bond pad 114b adjacent a second edge 120b of the chip 120. The interposer 130 of the illustrated embodiment also advantageously provides a pathway for electrically coupling the bottom pad 112a and the bottom solder ball 172a, located on or adjacent to the bottom surface 110a of the substrate 110, and the top pad 114b and the top solder ball 174a, located on or adjacent to the top surface 110b of the substrate 110. Therefore, the interposer 130 provides the same functionality as one or more additional circuit or trace layers within or on the substrate 110, allowing those additional circuit or trace layers to be omitted. The interposer 130 thus simplifies the design of the substrate 110, enabling it to have a lower profile and to be fabricated using less expensive processes. While the conductive path 1 provides one example of the advantages that the interposer 130 provides, additional conductive paths are also contemplated as consistent with the present embodiments.

With reference to FIG. 1B, the interposer 130 provides a conductive path 2 between a chip pad 122 and the top solder ball 174a. The conductive path 2 extends from the chip pad 122, through a bonding wire 146, a wire bond pad 114c, the wire bond pad 114d (which is electrically coupled to the wire bond pad 114c through a conductive trace), the bonding wire 142, the interposer 130, the bonding wire 144, and the wire bond pad 114b.

Other example conductive paths may extend between components disposed adjacent the same edge of the chip 120, and/or between components disposed on or adjacent the same surface of the substrate 110, and/or between components disposed anywhere within the package 100. Any electrical contact of the substrate 110 or the chip 120, including without limitation bonding pads, solder pads and solder balls, can be electrically coupled to any other electrical contact of the substrate 110 or the chip 120 through the interposer 130, such as a first contact selected from a chip pad, the bottom solder pads 112, the wire bond pads 114, and the top solder pads 116, and a second contact selected from a chip pad, the bottom solder pads 112, the wire bond pads 114, and the top solder pads 116.

Figure 2:
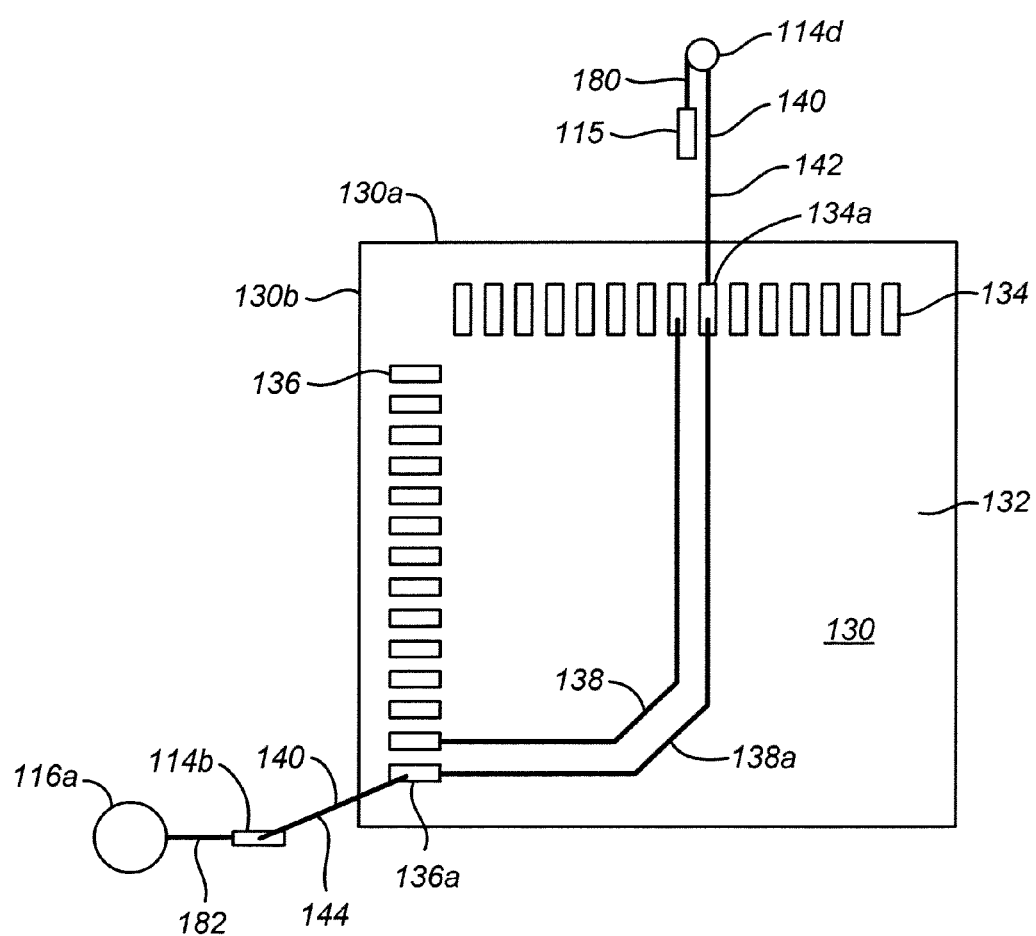
FIG. 2 is a top plan view of an interposer according to one of the present embodiments.

Referring to FIGS. 1 and 2, the interposer 130 includes bridge circuits that electrically couple various components. For example, a bridge circuit that electrically couples the via pad 115 and the wire bond pad 114b is illustrated in the top plan view of the interposer 130 of FIG. 2. The interposer 130 includes a dielectric base layer 132, a plurality of first interposer pads 134 disposed on or adjacent to the dielectric layer 132 and adjacent to a first edge 130a of the interposer 130, a plurality of second interposer pads 136 disposed on or adjacent to the dielectric layer 132 and adjacent to a second edge 130b of the interposer 130, and a plurality of conductive traces 138 disposed on or adjacent to the dielectric layer 132 and electrically connecting the first interposer pads 134 to corresponding ones of the second interposer pads 136. The first interposer pads 134, the second interposer pads 136, and the conductive traces 138 may be formed from a metal, a metal alloy, or another suitable electrically conductive material.

The bonding wires 140 electrically couple the first and second interposer pads 134, 136 to the wire bond pads 114 of the substrate 110. In particular, one of the first interposer pads 134a is wire bonded to one of the wire bond pads 114d through the bonding wire 142, and one of the second interposer pads 136a is wire bonded to one of the wire bond pads 114b through a bonding wire 144. Furthermore, a conductive trace 138a electrically couples the first interposer pad 134a and the corresponding second interposer pad 136a. Further, the via pad 115 is electrically coupled to the wire bond pad 114b through a conductive trace 180 of the substrate 110, the wire bond pad 114d, the bonding wire 142, the interposer pad 134a, the conductive trace 138a, the interposer pad 136a, and the bonding wire 144. In turn, the wire bond pad 114b is electrically coupled to a top solder pad 116a through a conductive trace 182 of the substrate 110.

Advantageously, a material composition of the interposer 130 can be similar to or the same as that of the substrate 110. For example, both the substrate 110 and the interposer 130 may be an organic material, such as polyimide tape, fiberglass reinforced bismaleimide-triazine (BT) resin, FR-4 fiberglass reinforced BT epoxy resin, Ajinomoto Build-Up Film (ABF), or other dielectric materials. Thus, the interposer 130 can be compatible with a manufacturing process of the substrate 110 to lower manufacturing costs. In addition, the interposer 130 can be formed with a high manufacturing precision to define locations of the first interposer pads 134, the conductive traces 138, and the second interposer pads 136.

Figure 3:
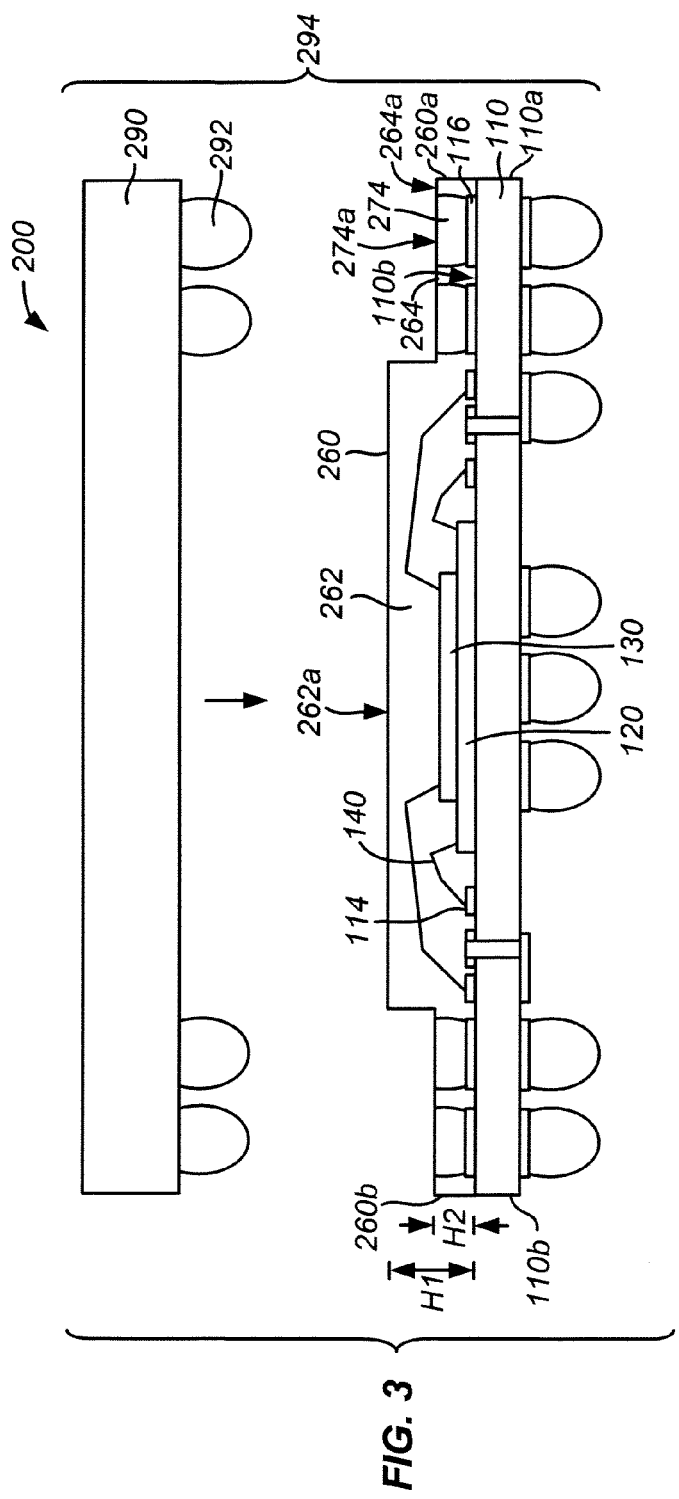
FIG. 3 is a cross-sectional view of a semiconductor package structure according to another of the present embodiments.

FIG. 3 is a cross-sectional view of a semiconductor device package 200 according to another of the present embodiments. Certain aspects of the package 200 of FIG. 3 are similar to aspects of the package 100 of FIG. 1A. Thus, those aspects are not further described with respect to FIG. 3.

With reference to FIG. 3, a package body 260 of the package 200 substantially covers the entire top surface 110b of the substrate 110, the chip 120, the interposer 130, the bonding wires 140, the wire bond pads 114, and the top pads 116. In other words, the package body 260 extends all the way to the edges of the substrate 110, such that edges 260a, 260b of the package body 260 are substantially aligned or co-planar with corresponding edges 110a, 110b of the substrate 110. However, the package body 260 exposes a top end or surface 274a of each of a plurality of the top solder balls 274. More specifically, the package body 260 includes a center portion 262 and a peripheral portion 264 surrounding the center portion 262. An elevation of a top surface 264a of the peripheral portion 264 is lower than an elevation of a top surface 262a of the center portion 262. That is, the peripheral portion 264 is recessed with respect to the center portion 262. The result of the recess of the peripheral portion 264 is to expose the top surfaces 274a of the top solder balls 274.

In one embodiment of a manufacturing process for making the package 200, a molding compound or encapsulant can be applied over the top surface 110b of the substrate 110 (to include chip 120, wire bonds 140 and top solder balls 274) so as to have a substantially uniform thickness H1. The thickness of the molding compound disposed above the top solder balls 274 can then be decreased from H1 to H2 by a thickness-decreasing process, such as grinding, sawing, polishing, laser scribing, chemical etching, or other thickness-decreasing processes. As a result, the peripheral portion 264 is formed, and the top solder balls 274 are exposed. The thickness-decreasing process may be controlled such that a height of each top solder ball 274 is decreased by a desired amount, with their top surfaces 274a being substantially aligned or co-planar with the top surface 264a of the peripheral portion 264. In certain embodiments, H2 may be equal to or less than about ⅔ of H1, such as from about 1/10 to about ⅔ of H1 or from about 1/10 to about ½ of H1, such that the height of each top solder ball 274 is decreased by a desired amount to result in a substantially hemispherical shape, thereby presenting or exposing the full or maximum circumference of the top solder balls 274.

The exposed top surfaces 274a of the top solder balls 274 can be electrically coupled to another device stacked thereonto form a stacked package assembly. For example, with reference to FIG. 3, another semiconductor device package 290, which serves as a top package, can be disposed above and electrically coupled to the package 200 to form a stacked package assembly 294. More specifically, bottom solder balls 292 of the package 290 can be electrically coupled to respective ones of the top solder balls 274 of the package 200 to form the assembly 294. While two packages 200, 290 are illustrated in FIG. 3, in other embodiments more than two packages may be included in the assembly 294. In other embodiments an unpacked chip (not shown) or any other device may be stacked on the package 200.

Figure 4:
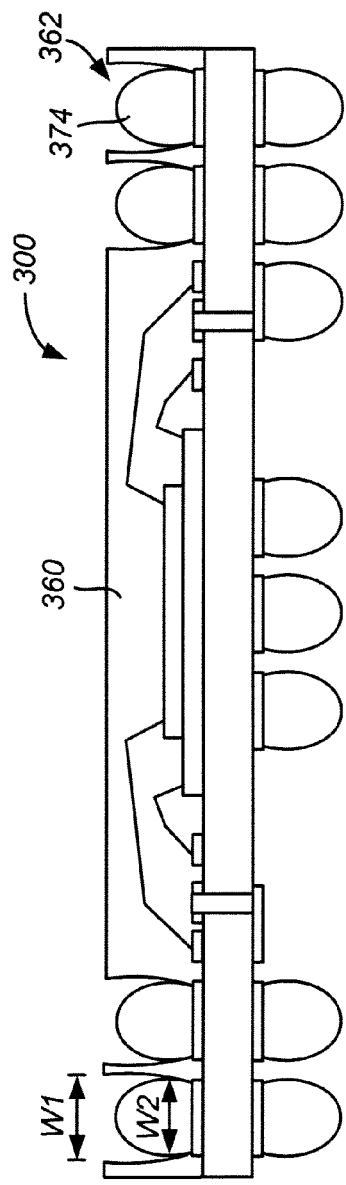
FIG. 4 is a cross-sectional view of a semiconductor package structure according to another of the present embodiments.

FIG. 4 is a cross-sectional view of a semiconductor device package 300 according to another of the present embodiments. Certain aspects of the package 200 of FIG. 3 are similar to aspects of the package 100 of FIG. 1A and the package 200 of FIG. 3. Thus, those aspects are not further described with respect to FIG. 4.

With reference to FIG. 4, a package body 360 of the package 300 has a substantially uniform thickness, except for locations of a plurality of cavities 362. The cavities 362 correspond to respective ones of a plurality of top solder balls 374, thus exposing the top solder balls 374. Accordingly, the package 300 can be electrically coupled through the top solder balls 374 to another device (not shown) stacked thereonto form a stacked package assembly.

In one embodiment of a manufacturing process for making the package 200, a molding compound can be applied with a substantially uniform thickness, and portions of the molding compound disposed above the top solder balls 374 can then be removed. Example processes for removing the molding compound disposed above the top solder balls 374 include laser ablation, chemical etching, plasma etching, or other removal processes. In certain embodiments, in order to ensure adequate exposure of the top solder balls 374 and improved stacking functionality, the cavities 362 can be configured with a size that is about the same as or larger than that of the top solder balls 374. More specifically, a lateral dimension of each cavity 362 adjacent to a top surface of the package body 360 is greater than or equal to a lateral dimension of a corresponding top solder ball 374. The lateral dimensions may be a maximum lateral dimension or an average of lateral dimensions along orthogonal directions. For example, a ratio of the lateral dimension W1 of the cavity 362 and the lateral dimension W2 of the corresponding top solder ball 374 can be represented as follows: $W1=aW2 \geq W2$, where a is in the range of about 1 to about 1.5. More specifically, a may be in the range of from about 1.02 to about 1.3, from about 1.02 to about 1.2, or from about 1.05 to about 1.1. In certain embodiments the cavities 362 can be formed as part of a molding process.

Although wire bonding is adopted in the aforementioned embodiments to electrically connect a chip and a substrate of a semiconductor device package, the manner of electrically connecting the chip and the substrate is not limited thereto. For example, and without limitation, a flip-chip bonding process or another bonding process can be adopted in the package to electrically connect the chip 120 and the substrate 110.

Similarly, a flip-chip bonding process or another bonding process can be adopted to electrically connect the interposer 130 and the substrate 110.

In certain of the present embodiments, a semiconductor device package is provided with an interposer, which serves as an intermediate or bridge circuit of various electrical pathways in the package to electrically connect any two or more electrical contacts, such as any two or more electrical contacts of a substrate and a chip. In particular, the interposer provides electrical pathways for simplifying a circuit layout of the substrate, reducing the number of layers of the substrate, thereby reducing package height and manufacturing cost. Furthermore, the tolerance of the circuit layout can be increased or maintained, while controlling signal interference between adjacent traces and accommodating high density circuit designs. Moreover, the package is suitable for a PoP process or other three dimensional packaging solutions, where a profile of top solder balls on the substrate and a package body can be varied according to particular applications, so as to expose at least a portion of each of the top solder balls and electrically connect the package to another device through the exposed, top solder balls.

While the invention has been described with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
   a substrate including a first surface, a second surface opposite the first surface, a plurality of first electrical contacts disposed on or adjacent to the first surface, and a plurality of second electrical contacts disposed on or adjacent to the second surface;
   a semiconductor chip disposed on or adjacent to the second surface of the substrate, and electrically coupled to the substrate; and
   an interposer disposed on or adjacent to the semiconductor chip and electrically coupled to the substrate;
   wherein at least one of the first contacts is electrically coupled to at least one of the second contacts through the interposer.

2. The semiconductor device package of claim 1, wherein the substrate further includes a conductive via extending through the substrate, and the at least one of the first contacts is electrically coupled to the at least one of the second contacts through the interposer and the conductive via.

3. The semiconductor device package of claim 1 wherein the first contacts include a plurality of wire bond pads, the wire bond pads being laterally spaced from the chip, the interposer being electrically coupled to a first subset of the wire bond pads by wire bonding, and the chip being electrically coupled to a second subset of the wire bond pads by wire bonding.

4. The semiconductor device package of claim 3, wherein the first contacts further include a plurality of solder pads that are laterally spaced from the chip, with the wire bond pads being disposed between the solder pads and the chip.

5. The semiconductor device package of claim 1, further comprising a package body covering at least the chip and the interposer.

6. The semiconductor device package of claim 5, wherein the package body stops short of at least one edge of the substrate, leaving a subset of the electrical contacts exposed.

7. The semiconductor device package of claim 5, wherein the package body extends to edges of the substrate, but leaves a subset of the electrical contacts exposed.

8. The semiconductor device package of claim 7, wherein the package body defines a plurality of cavities that leave the subset of the electrical contacts exposed.

9. The semiconductor device package of claim 7, wherein the package body includes a center portion and a peripheral portion surrounding the center portion, the peripheral portion having a lesser height than the center portion, and the peripheral portion exposes the subset of the electrical contacts.

10. The semiconductor device package of claim 1, wherein the interposer includes:
    a dielectric base layer;
    a first interposer pad disposed on or adjacent to the base layer and electrically coupled to the at least one of the first contacts;
    a second interposer pad disposed on or adjacent to the base layer and electrically coupled to the at least one of the second contacts; and
    a conductive trace disposed on or adjacent to the base layer and electrically coupled between the first interposer pad and the second interposer pad.

11. The semiconductor device package of claim 10, wherein the first interposer pad is disposed adjacent a first edge of the interposer, and the second interposer pad is disposed adjacent a second edge of the interposer.

12. A semiconductor device package, comprising:
    a substrate including an upper surface, a plurality of electrical contacts disposed on or adjacent to the upper surface;
    a chip coupled to the upper surface of the substrate, and electrically coupled to the substrate, the chip including a plurality of edges; and
    an interposer disposed on or adjacent to the chip and electrically coupled to the substrate;
    wherein a first one of the contacts is located adjacent a first one of the edges of the chip, and a second one of the contacts is located adjacent a second one of the edges of the chip, and the first contact is electrically coupled to the second contact through the interposer.

13. The semiconductor device package of claim 12, wherein the interposer includes:
    a dielectric base layer;
    a first interposer pad disposed on or adjacent to the base layer and electrically coupled to the at least one of the first contacts;
    a second interposer pad disposed on or adjacent to the base layer and electrically coupled to the at least one of the second contacts; and a conductive trace disposed on or adjacent to the base layer and electrically coupled between the first interposer pad and the second interposer pad.

14. The semiconductor device package of claim 13, wherein the first interposer pad is disposed adjacent a first edge of the interposer, and the second interposer pad is disposed adjacent a second edge of the interposer.

15. The semiconductor device package of claim 12, wherein the first contacts include a plurality of wire bond pads, the wire bond pads being laterally spaced from the chip, the interposer being electrically coupled to a first subset of the wire bond pads by wire bonding, and the chip being electrically coupled to a second subset of the wire bond pads by wire bonding.

16. The semiconductor device package of claim 15, wherein the first contacts further include a plurality of solder pads that are laterally spaced from the chip, with the wire bond pads being disposed between the solder pads and the chip.

* * * * *